United States Patent [19]

Sezi et al.

[11] Patent Number: 5,384,220
[45] Date of Patent: Jan. 24, 1995

[54] PRODUCTION OF PHOTOLITHOGRAPHIC STRUCTURES

[75] Inventors: Recai Sezi, Roettenbach; Horst Borndoerfer; Rainer Leuschner, both of Erlangen; Michael Sebald, Hessdorf-hannberg; Siegfried Birkle, Hoechstadt A/Aisch; Hellmut Ahne, Roettenbach, all of Germany

[73] Assignee: Siemens Aktiengesellschaft, Munich, Germany

[21] Appl. No.: 811,706

[22] Filed: Dec. 20, 1991

[30] Foreign Application Priority Data

Dec. 20, 1990 [DE] Germany ............................ 4041002

[51] Int. Cl.$^6$ ........................... G03F 7/36; G03F 7/38
[52] U.S. Cl. ............................... 430/8; 430/296; 430/313; 430/314; 430/323; 430/324; 430/325; 430/326; 430/330; 430/946; 430/966; 156/628; 156/643
[58] Field of Search .............. 430/330, 323, 326, 325, 430/313, 271, 270, 317, 8, 314, 324, 296, 942, 966; 156/643, 628

[56] References Cited

U.S. PATENT DOCUMENTS

| | | | |
|---|---|---|---|
| 4,491,628 | 1/1985 | Ito et al. ................... | 430/176 |
| 4,508,812 | 4/1985 | Brault ....................... | 430/270 |
| 4,551,418 | 11/1985 | Hult et al. .................. | 430/325 |
| 4,552,833 | 11/1985 | Ito et al. ................... | 430/325 |
| 4,613,398 | 9/1986 | Chiong et al. ................ | 156/628 |
| 4,657,845 | 4/1987 | Frechet et al. ............... | 430/326 |
| 4,921,778 | 5/1990 | Thackeray et al. ............. | 430/326 |

FOREIGN PATENT DOCUMENTS

| | | |
|---|---|---|
| 0136130 | 4/1985 | European Pat. Off. . |
| 0234327 | 9/1987 | European Pat. Off. . |
| 0248779 | 12/1987 | European Pat. Off. . |
| 0281182 | 9/1988 | European Pat. Off. . |
| 0318956 | 6/1989 | European Pat. Off. . |
| 394740 | 10/1990 | European Pat. Off. . |
| 0394740 | 10/1990 | European Pat. Off. . |
| 53-81116 | 7/1978 | Japan ................... 430/270 |

OTHER PUBLICATIONS

PTO English–language translation of European Patent 394740.
"J. Electrochem. Soc.", vol. 136 (1989), pp. 1453–1456.
"Microelectronic Engineering", vol. 3 (1985), pp. 279–291.
"Mat. Res. Soc. Symp. Proc.", vol. 45 (1985), pp. 197–202.
"IBM Techn. Discl. Bull.", vol. 27, No. 4A (1984) p. 2197.

*Primary Examiner*—Janis L. Dote
*Attorney, Agent, or Firm*—Kenyon & Kenyon

[57] ABSTRACT

A method for the photolithographic production of structures in the submicron range including the following steps:
- a photoresist layer comprising a polymer containing carboxylic acid anhydride and carboxylic acid tert. butyl ester groups, a photoinitiator which releases an acid when exposed, and a suitable solvent is applied to a substrate;
- the photoresist layer is dried;
- the photoresist layer is exposed in an imagewise manner;
- the exposed photoresist layer is subjected to temperature treatment;
- the photoresist layer treated in this way is subjected to liquid silylation;
- the silylated photoresist layer is dry-developed in an anisotropic oxygen plasma;

where the temperature treatment is handled in such a way that the photoresist becomes hydrophilic in the exposed areas.

12 Claims, No Drawings

PRODUCTION OF PHOTOLITHOGRAPHIC STRUCTURES

BACKGROUND OF THE INVENTION

1. Field of the Invention

The invention relates to a method for the photolithographic production of structures in the submicron range.

2. Description of Related Art

In the photolithographic production of structures, TSI single-layer resists (TSI=top surface imaging) which can be dry-developed exhibit the advantages of two-layer resists (with wet development of the top resist and dry development of the bottom resist), such as suppression of reflections and reduction of topography effects. Furthermore, they offer the additional advantage that only a single resist layer has to be applied to the substrate, generally a silicon wafer, and that wet development is eliminated. A detailed description of systems of the type stated is found in "Introduction to Microlithography," ACS Symposium Series 219 (1983), pages 287 to 350.

TSI resists are known both in the form of single-layer systems which work in positive manner, and in the form of single-layer systems which work in negative manner and can be dry-developed. In contrast to negative systems, positive TSI systems, because of their lower defect density, are much better suited for applications in the contact hole planes, which are very critical.

Single-layer systems which can be dry-developed function according to the following principle:
- application of the resist to a silicon wafer;
- exposure, and, if necessary, heating, in order to produce a "latent" image;
- treatment with a metallization agent, for example an organometal compound, where the resist, in the exposed areas (negative resists) or in the unexposed areas (positive resist), becomes resistant to dry development, especially in oxygen plasma;
- dry development.

This number of process steps is not supposed to be exceeded in production.

A high-resolution TSI system which is practical for production is supposed to satisfy the following requirements:

1. Simple and line-compatible processing
   More process steps than the ones stated above mean a greater cost expenditure, where the additional costs can be caused by capital investments for additional equipment and/or reagents as well as by error sources due to the additional process steps, which result in a lower yield.
2. Great sensitivity
   The lower the sensitivity, the lower the throughput at the expensive steppers, and the greater the costs. A high sensitivity in the DUV range (DUV=deep UV), for example at 248 nm, is particularly important, since resolution increases with a decreasing wavelength.
3. High resistance to plasma development, i.e. ability to be developed without residue
   A high resistance of the areas treated with the metallization agent is important for a high degree of freedom in the process in dry developing, while the ability to be developed without residue is important for yield. In order to achieve the ability to be developed without residue, a two-stage etch process is sometimes necessary, with developing taking place first in a plasma containing halogen, and then in an oxygen plasma. This in turn presupposes a very great etch stability of the layer areas treated with the metallization agent.

In order to solve the problem of a low DUV sensitivity of photoresists, resist systems were developed, the base polymers of which demonstrate tert. butyl ester or tert. butoxycarbonyloxy groups (see in this regard U.S. Pat. Nos. 4,491,628 and 4,552,833). When exposed in the presence of a strong acid forming agent, for example a so-called Crivello salt, carboxyl or phenolic OH groups are formed, with a single proton splitting off several groups, according to the principle of so-called "chemical amplification" (see in this regard, for example "J. Electrochem. Soc.," Vol. 136 (1989), pages 1453 to 1456).

Several TSI systems are already known, but none of them completely satisfies the requirements stated above:

- EP-OS 0 136 130
  With the process described, positive and negative structures can be produced, with UV light or with electron beams. The need for a special apparatus (for vacuum) as well as the requirement for metallization with corrosive or toxic gases, such as $B_2H_6$, $SiCl_4$ and $TiCl_4$, which are not very well suited for production, is a disadvantage.
- U.S. Pat. No. 4,551,418
  A method for the production of a negative resist structure is described, in which a base polymer which contains a cationic photoinitiator, especially a triaryl sulfonium salt or a trihalogenated methyl triazine, is used. After exposure, the resist layer is then treated with a monomer which can be cationically polymerized, such as epoxy siloxane and epoxy silane, or styrene silyl ether (in the gas phase or in solution), in order to form a polymer film, which protects the exposed areas during the subsequent plasma etch process.
- U.S. Pat. No. 4,613,398
  Systems which work positively and negatively are described, where the permeability of the resist relative to the metallization agent is changed by exposure. Disadvantages of this system in the positive mode are a low DUV sensitivity (50 to 300 mJ/cm$^2$) and the requirement of silylation with hexamethyl cyclotrisilazane in o-xylene at 65° C., for which a special apparatus is required, and thus there is little production line compatibility.
- U.S. Pat. No. 4,657,845
  A method is described, which is based on the principle of chemical amplification and demonstrates high DUV sensitivity (approximately 6 mJ/cm$^2$). However, two additional process steps are required here, namely a metal-free treatment with methyl isocyanate, specifically in the vacuum oven, as well as flood exposure.
- EP-OS 0 248 779
  Although the method described involves few process steps, a special apparatus for gas phase silylation at an elevated temperature is required. In addition, the system of polyvinyl phenol and bisazide used does not have great DUV sensitivity. The same also applies for a system known from EP-OS 0 318 956.
- EP-OS 0 281 182 and U.S. Pat. No. 4,921,778
  Although the systems described demonstrate good DUV sensitivity, they have the disadvantage that a special apparatus for silylation from the gas phase at an elevated temperature is required. Furthermore, the silylated areas demonstrate only moderate etch resistance, due to the embedding of monomer silicon fragments, such as $Si(CH_3)_3$ groups (see also in this regard: "Microelectronic Engineering," Vol. 3 (1985), pages 279 to 291).
- "Mat. Res. Soc. Symp. Proc.," Vol. 45 (1985), pages 197 to 202, as well as "IBM Tech. Discl. Bull.," Vol. 27, No. 4A (1984), page 2197
  The method described is based on the decarboxylation of homopolymers or copolymers of (meth)acrylic acid, and possibly of its anhydride, by high-energy radiation and silylation of the unexposed areas from the gas phase. The disadvantages consist of the gas phase silylation (requirement of special equipment), the relatively low etch resistance in the oxygen plasma (due to silylation with hexamethyl disilazane) and the lack of DUV sensitivity of a decarboxylation reaction of the type stated.

Furthermore, a structuring method with dry development has already been proposed, which yields positive images, where subsemimicron structures can be produced, using normal apparatus (see: U.S. patent application Ser. No. 682,142 dated Apr. 8, 1991, now U.S. Pat. No. 5,229,258 issued Jul. 29, 1993). However, this method involves two additional process steps, namely treatment of the exposed photoresist layer with a polyfunctional organic compound, especially a polyamine, and flood exposure.

In addition, a method has already been proposed, with which high-resolution negative resist structures with steep slopes can be obtained, using a resist system that can be dry-developed (see: U.S. patent application Ser. No. 692,364 dated Apr. 26, 1991, now U.S. Pat. No. 5,262,283 issued Nov. 16, 1993). The resist system in this case is based on a polymer which has anhydride groups as well as blocked imide or phenolic hydroxyl groups, and an acid forming agent. This system, which functions according to the principle of chemical amplification, does have a greater sensitivity than comparable known systems (see: EP-OS 0 394 740), especially in the DUV spectrum (for example at an exposure of 248 nm), but still does not entirely fulfill the latest strict requirements of production. According to these, the sensitivity is supposed to be better than 20 $mJ/cm^2$, measured with steppers with a KrF excimer laser as the light source (not with contact exposure devices with a Hg/Xe lamp, which simulate sensitivity which is better by a factor of at least 4).

SUMMARY OF THE INVENTION

It is an object of the invention to provide a method for photolithographic production of high-resolution structures (subsemimicron range) with steep slopes, i.e. a TSI resist system which can be dry-developed and is suitable for this purpose, which can be easily processed, has great etch resistance and great sensitivity (<20 $mJ/cm^2$), especially in the DUV range. In this connection, it is supposed to be possible to carry out the metallization process, i.e. silylation, under normal conditions in standard production equipment.

This is accomplished, according to the invention, as follows:
- a photoresist layer comprising a polymer containing carboxylic acid anhydride and carboxylic acid tert. butyl ester groups, a photoinitiator which releases an acid when exposed, and a suitable solvent is applied to a substrate,
- the photoresist layer is dried,
- the photoresist layer is exposed in an imagewise manner,
- the exposed photoresist layer is subjected to temperature treatment,
- the photoresist layer treated in this way is subjected to liquid silylation, and
- the silylated photoresist layer is dry-developed in an anisotropic oxygen plasma, i.e. in a plasma containing oxygen, where the temperature treatment is conducted in such a way that the photoresist becomes hydrophilic in the exposed areas.

DETAILED DESCRIPTION OF THE INVENTION

In the method according to the invention, the following points are of particular importance:
- The photoresist used has a special base polymer, specifically a polymer which possesses carboxylic acid anhydride and carboxylic acid tert. butyl ester groups. In this connection, an etch resistance to substrate etch processes should be present, i.e. the resist preferably also contains aromatic groupings.
- The temperature treatment ("post exposure bake") is carried out in such a manner that the resist becomes hydrophilic in the exposed areas. What happens during this step is that acid-catalyzed ester splitting takes place in the exposed areas, i.e. the tert. butyl groups are split off, with free carboxylic acid groups being formed, which splitting is caused by the acid photochemically produced during the exposure.
- Silylation takes place in the liquid phase, under standard conditions, i.e. at room temperature and standard pressure, in conventional spray or puddle development apparatus.

In order to achieve acid-catalyzed splitting of the tert. butyl groups, the temperature treatment in the method according to the invention is advantageously carried out at temperatures between 80° and 140° C., especially at 110° to 120° C. The duration of the temperature treatment is preferably 15 to 200 s, preferably approximately 60 s. These values particularly apply when using a hot plate. If the temperature treatment takes place in some other way, for example in a circulating air oven, then certainly higher temperatures and/or longer treatment times might be necessary.

In the method according to the invention, the liquid silylation results in etch resistance to dry development in the oxygen plasma. In this connection, the type of silylation solution determines whether the unexposed, hydrophobic areas of the resist layer or the exposed, hydrophilic areas are selectively silylated. For the production of positive structures, liquid silylation takes place with a non-polar, aprotic silylation solution. If negative structures are supposed to be produced, the resist layer is treated with a polar, protic silylation solution.

In general, silicon compounds in the form of aminosilanes or aminosiloxanes are used as the silylation agent; these compounds can be of an oligomeric nature. In the generation of positive structures, an aminosiloxane, for example, surprisingly does not react with the carboxylic acid formed in the exposed areas, when the resist exposed through a mask is treated, i.e. the generally expected acid-base reaction does not take place, and instead it reacts with the anhydride in the unexposed areas.

The non-polar, aprotic silylation solutions for the production of positive structures are preferably organic solutions, i.e. solutions of the silylation agent in an organic solvent. Anisole, dibutyl ether and/or diethylene glycol dimethyl ether are advantageously used as such solvents; however, toluene and xylene as well as other solvents with a high boiling point can also be used, for example. The polar, protic silylation solutions used for the production of negative structures are preferably aqueous organic solutions of the silylation agent. In this connection, it is advantageous if the silylation agent is dissolved in mixtures of water and alcohol, especially ethanol and/or isopropanol; in addition, water-miscible ethers, for example, can also be used.

In the method according to the invention, those polymers in which the carboxylic acid anhydride groups are based on maleic acid anhydride are preferably used. Another compound of this type is itaconic acid anhydride, for example. The polymers can have both cyclic anhydride functions, where these are arranged in the main chain or in the side chain, as well as non-cyclic, i.e. linear anhydride functions. A number of corresponding monomers are known from EP-OS 0 388 484.

Preferably, the carboxylic acid tert. butyl ester groups are based on acrylic acid, methacrylic acid or vinyl benzoic acid tert. butyl ester. Other compounds of this type are, for example, the tert. butyl esters of maleic acid, fumaric acid, itaconic acid and cinnamic acid.

Preferably, copolymers of maleic acid anhydride and acrylic acid, methacrylic acid or vinyl benzoic acid tert. butyl ester are used in the method according to the invention. However, terpolymers can also be advantageously used, with these being produced from monomer mixtures containing a tert. butyl ester of an unsaturated carboxylic acid, maleic acid anhydride and styrene.

Mixed polymers made from carboxylic acid tert. butyl esters and carboxylic acid anhydrides which can be used in the method according to the invention are the object of the cofiled U.S. patent application Ser. No. 07/811,831, entitled "Mixed Polymers". Here, the mixed polymers can be structured not only as copolymers (of the type stated), but also as terpolymers. An unsaturated compound is additionally built into such polymers, for example an unsaturated aromatic compound, such a styrene, α-methyl styrene or vinyl naphthalene.

In the method according to the invention, known compounds can be used as the photoinitiator, which is also called photo acid (see in this regard, for example, U.S. Pat. No. 4,491,628 and EP-OS 0 234 327). The only important thing for the selection of the photoinitiator is the required property of releasing an acid upon exposure. Exposure takes place with UV light or with electron beams or X-rays, where it is advantageous if a strong acid is formed. The acid then causes the tert. butyl ester to split off from the carboxylic acid tert. butyl ester group, specifically during temperature treatment which follows the exposure.

The photoinitiator is preferably an onium compound. Such compounds, which are also referred to as Crivello salts, are, for example, diphenyl iodonium and triphenyl sulfonium triflate (the trifluoromethane sulfonyl group is referred to a triflate). Other photoinitiators which can be used are, for example, triazine derivatives. The photoinitiator is generally used in a concentration of 1 to 20% by mass, with reference to the dry photoresist, i.e. the solvent-free resist composition.

Known resist solvents are used as the solvent. The only requirement which is important for the selection of the solvent is that both the polymer component and the photoinitiator have to be dissolved. In addition, defect-free resist layers have to be formed on the substrates, for example on silicon wafers or on wafers coated with a bottom resist, using the known coating methods. Preferably, the solvent is cyclohexanone or methoxypropyl acetate; in addition, diethylene glycol dimethyl ether, for example can also be used.

By means of the method according to the invention, both positive and negative structures can be produced. Furthermore, this method can be used both in single-layer and in two-layer resist technology. The method also offers the possibility of inspection, for example of the line width, before etching, which proves to be an advantage in production. Furthermore, this method, especially in comparison with the method according to the U.S. patent applications Ser. No. 682,142, now U.S. Pat. No. 5,229,258 and Ser. No. 692,364, now U.S. Pat. No. 5,262,283, is characterized by clearly greater sensitivity, as well as by clearly greater etch resistance of the silylated areas as compared with reactive ion etching in oxygen plasma, as well as by clearly better silylation selectivity. In addition to the high sensitivity of 1 to 5 $mJ/cm^2$, especially in the DUV range, a resolution in the subsemimicron range and simple processing in standard production apparatus (at room temperature and standard pressure), in particular, are further special characteristics of the TSI system according to the invention.

The invention will now be explained in greater detail with reference to exemplary embodiments. In this connection, the following starting materials and/or reagents are used (MT=parts by mass):
- Base polymer (1):
  Copolymer of p-vinyl benzoic acid tert. butyl ester and maleic acid anhydride, produced by radical polymerization of the two monomers in toluene with azoisobutyric acid nitrile as the initiator.
- Base polymer (2):
  Copolymer of acrylic acid tert. butyl ester and maleic acid anhydride, produced by radical polymerization of the two monomers in toluene with azoisobutyric acid nitrile as the initiator.
- Base polymer (3):
  Copolymer of methacrylic acid tert. butyl ester and maleic acid anhydride, produced by radical polymerization of the tow monomers in toluene with azoisobutyric acid nitrile as the initiator.
- Photoactive component (1):
  This is a compound which forms a strong acid upon exposure; suitable acid forming agents are, in particular, onium compounds known as Crivello salts, as well as triazine derivatives; triphenyl sulfonium trifluoromethane sulfonate is used here.

- Photoactive component (2):
    Here, the acid forming agent is diphenyl iodonium trifluoromethane sulfonate.
- Silylation solution (1):
    Organic solution, consisting of 5 MT diaminosiloxane, 40 MT dibutyl ether and 55 MT anisol; preferably, an α,ω-aminofunctional siloxane, especially with two end-position aminopropyl groups and 2 to 20 silicon atoms in the chain, is used; an example is the commercially available product Tegomer A-Si 2120 (Goldschmidt).
- Silylation solution (2):
    Organic solution, consisting of 2 MT diaminosiloxane (Tegomer A-Si 2120), 67.1 MT dibutyl ether, and 30.9 MT diethylene glycol dimethyl ether.
- Silylation solution (3):
    Organic solution, consisting of 4 MT diaminosiloxane (Tegomer A-Si 2120), 49.2 MT dibutyl ether, and 46.8 MT anisol.
- Silylation solution (4):
    Aqueous organic solution, consisting of 1.3 MT diaminosiloxane (Tegomer A-Si 2120), 50.4 MT ethanol, 45.8 MT isopropanol, and 2.5 MT water.
- Silylation solution (5):
    Aqueous organic solution, consisting of 1 MT diaminosiloxane (Tegomer A-Si 2120), 94.3 MT isopropanol, and 4.7 MT water.

EXAMPLE 1

A resist consisting of 25.8 MT base polymer (1), 2.2 MT photoactive component (1) and 72 MT methoxypropyl acetate is spun onto a silicon wafer and dried on a hot plate for 60 s at 100° C.; the layer thickness of the resist is 1.3 μm. The resist is then contact-exposed through a mask, at 2.2 mJ/cm$^2$ (device MJB 3, Karl Süss; λ=250 nm) and tempered on the hot plate for 60 s at 110° C. Then the resist is treated with the silylation solution (1) in a puddle development apparatus (type CEM 2000, Convac), at room temperature and standard pressure, for 30 s, and then rinsed with dibutyl ether for 30 s and dried. After drying, the wafer is placed into a plasma etch system (type MIE 720, Material Research Corporation) and the resist is dry-developed in oxygen plasma (O$_2$/RIE: 1.8 mTorr gas pressure, 30 sccm gas flow, 40 V bias voltage, 0.9 kW output, with magnet). Positive structures up to 0.4 μm with vertical slopes and a line/space ratio of 1:1 are obtained.

EXAMPLE 2

A resist consisting of 23.75 MT base polymer (2), 1.25 MT photoactive component (2) and 75 MT diethylene glycol dimethyl ether is spun onto a silicon wafer and dried on a hot plate for 60 s at 100° C.; the layer thickness of the resist is 1.2 μm. The resist is then contact-exposed through a mask, at 0.9 mJ/cm$^2$ (device MJB 3, Karl Süss; λ=250 nm) and tempered on the hot plate for 60 s at 110° C. Then the resist is treated with the silylation solution (2) in a puddle development apparatus (type CEM 2000-U, Convac), at room temperature and standard pressure, for 20 s, and then rinsed with dibutyl ether for 30 s and dried. After drying, the resist is dry-developed in a plasma etch system (type MIE 720, Material Research Corporation) in oxygen plasma, corresponding to Example 1. Positive structures up to 0.4 μm with vertical slopes and a line/space ratio of 1:1 are obtained.

EXAMPLE 3

A commercially available positive resist based on Novolak is spun onto a silicon wafer (as the substrate), and dried at 90° C. for 1 min; then this is heated at 240° C. for 35 min in a circulating air oven. After heating, the thickness of the resist, which serves as a planarization layer, is 1.3 μm.

A resist consisting of 11.16 MT base polymer (3), 0.84 MT photoactive component (1) and 88 MT methoxypropyl acetate is spun onto the planarization layer. After drying on a hot plate for 60 s at 100° C., the layer thickness of this top resist is 0.3 μm. The resist is then contact-exposed through a mask, at 0.7 mJ/cm$^2$ (device MJB 3, Karl Süss; λ=250 nm) and tempered on the hot plate for 60 s at 110° C. Then the resist is treated with the silylation solution (3) in a puddle development apparatus (type CEM 2000, Convac), at room temperature and standard pressure, for 45 s, and then rinsed with dibutyl ether for 30 s and dried. After drying, the resist is dry-developed in a plasma etch system (type MIE 720, Material Research Corporation) in oxygen plasma, corresponding to Example 1. Positive structures up to 0.4 μm with vertical slopes and a line/space ratio of 1:1 are obtained.

EXAMPLE 4

The method of procedure is the same as in Example 3, but the exposure (through a mask) takes place by means of a DUV stepper (Canon Excimer Laser Stepper FPA 4500; λ=248 nm, NA=0.37). The dose required for 1:1 images is clearly higher when using this exposure device than with contact exposure according to Example 3, and amounts to 3.9 mJ/cm$^2$ in the present case. After dry development, positive structures up to 0.3 μm with a line/space ratio of 1:1 and contact holes, true to size, up to 0.4 μm are obtained; the structures and contact holes have vertical slopes.

EXAMPLE 5

The method of procedure is the same as in Example 2, but dry development in the plasma etch system takes place in a two-stage process. First, etching takes place for 6 s with a plasma which also contains tetrafluoromethane (CF$_4$) in addition to oxygen (O$_2$) (oxygen flow: 80 sccm, CF$_4$ flow: 9 sccm; total gas pressure: 8.1 mTorr; bias voltage: 40 V; with magnet). Subsequently, etching is carried out in a pure oxygen plasma (total gas pressure: 1.9 mTorr; bias voltage: 50 V; with magnet). Structures up to 0.4 μm with vertical slopes and a line/space ratio of 1:1 are obtained.

EXAMPLE 6

A resist corresponding to Example 3 is applied to a silicon wafer and dried, in the manner described there. The entire surface of the resist is then exposed at 1.5 mJ/cm$^2$ (device MJB 3, Karl Süss; λ=250 nm), subsequently tempered at 110° C. for 60 s. After cooling, it is treated for 60 s in a puddle development apparatus, in corresponding manner, with the silylation solution (3), then rinsed with dibutyl ether for 30 s and dried. After drying, the wafer is placed into a plasma etch system (type MIE 720, Material Research Corporation) and the resist is dry-etched for 200 s in oxygen plasma (O$_2$/RIE: 1.8 mTorr gas pressure, 30 sccm gas flow, 40 V bias voltage, 0.9 kW output, with magnet). From the measurements of layer thickness before and after etching, an etch rate of the silylated layer of 0.69 nm/s is calculated.

If resists according to the U.S. patent application Ser. No. 682,142 (made from a polymer containing chemically reactive groups, especially anhydride groups, and a photoactive component based on diazoketone or quinone diazide) are silylated as indicated there (see the corresponding embodiments), and the silylated layers are etched under the conditions described above, then etch rates of the silylated layers which lie between 0.95 and 1.05 nm/s are measured in all cases. The layers containing silicon produced within the scope of the present patent application generally demonstrate an etch resistance during dry development in oxygen plasma ($O_2$/RIE) that is approximately 30% greater, in comparison.

EXAMPLE 7

Corresponding to Example 3, a photoresist is applied to a planarization layer; the layer thickness of this top resist is 0.3 μm, after drying at 90° C. for 60 s. The resist is then contact-exposed through a mask at 1.6 mJ/cm$^2$ (device MJB 3, Karl Süss; λ=250 nm), and tempered on a hot plate at 110° C. for 60 s. Afterwards, the exposed areas are very selectively silylated by treatment with the silylation solution (4), for a period of 25 s, in a puddle development apparatus (type CEM 2000, Convac), then rinsed with isopropanol for 30 s and dried. Silylation results in a layer increase of more than 250 nm in the exposed areas, while no measurable increase occurs in the non-exposed areas. After drying, the wafer is placed into a plasma etch system (type MIE 720, Material Research Corporation) and the resist is dry-developed in oxygen plasma ($O_2$/RIE: 1.8 mTorr gas pressure, 30 sccm gas flow, 40 V bias voltage, 0.9 kW output, with magnet). Negative structures up to 0.4 μm with vertical slopes and a line/space ratio of 1:1 are obtained.

EXAMPLE 8

The method of procedure is the same as in Example 7, but exposure (through a mask) takes place by means of a DUV stepper (Canon Excimer Laser Stepper FPA 4500; λ=248 nm, NA=0.37). The dose required for 1:1 images is clearly higher when using this exposure device than with contact exposure according to Example 7, and amounts to 9.5 mJ/cm$^2$ in the present case. After dry development, negative structures up to 0.3 μm with a line/space ratio of 1:1 and contact holes, true to size, up to 0.4 μm are obtained; the structures and contact holes have a slope angle of 90°.

EXAMPLE 9

The method of procedure is the same as in Example 2, but the resist is exposed at 1.3 mJ/cm$^2$; silylation in the puddle development apparatus (room temperature, standard pressure) takes place with the silylation solution (5) for a period of 40 s. After corresponding dry development in oxygen plasma, negative structures up to 0.4 μm with vertical slopes and a line/space ratio of 1:1 are obtained.

EXAMPLE 10

Corresponding to Example 2 a resist is applied to a silicon wafer and dried. The entire surface of the resist is then exposed at 1.5 mJ/cm$^2$ (device MJB 3, Karl Süss; λ=250 nm), subsequently tempered at 110° C. for 60 s. After cooling, it is treated for 120 s in a puddle development apparatus, in corresponding manner as in Example 3, with the silylation solution (5), then rinsed with isopropanol for 30 s and dried. After drying, the resist is dry-etched according to Example 6. From the measurements of layer thickness before and after etching, an etch rate of the silylated layer of 0.67 nm/s is calculated.

If resists according to the U.S. patent application Ser. No. 692,364 (made from a polymer containing anhydride groups and blocked imide or phenolic hydroxyl groups, and a photoactive component in the form of a compound which forms a strong acid upon exposure) are silylated as indicated there (see the corresponding embodiments), and the silylated layers are etched under the conditions described above, then etch rates of the silylated layers which lie between 0.95 and 1.05 nm/s are measured in all cases. The layers containing silicon produced within the scope of the present patent application generally demonstrate an etch resistance during dry development in oxygen plasma ($O_2$/RIE) that is approximately 30% greater, in comparison.

What is claimed is:

1. A method for the photolithographic production of structures in the submicron range, comprising the steps of:
   - applying to a substrate a photoresist layer comprising a polymer having carboxylic acid anhydride and carboxylic acid tert. butyl ester groups, a photoinitiator which releases an acid when exposed to UV light or electron beams or x-rays, and a solvent,
   - drying the photoresist layer,
   - exposing the photoresist layer in an imagewise manner to UV light or electron beams or x-rays,
   - subjecting the exposed photoresist layer to a post exposure bake,
   - subjecting the baked photoresist layer to liquid silylation in a non-polar, aprotic silylation solution comprising a silylation agent selected from the group consisting of aminosilanes and aminosiloxanes, and
   - dry-developing the silylated photoresist layer in an anisotropic oxygen plasma, where the post exposure bake is conducted in such a way that the photoresist becomes hydrophilic in the exposed areas.

2. The method according to claim 1 wherein the post exposure bake takes place in a range between 80° and 140° C. for a period of 15 to 200 s.

3. The method according to claim 2 wherein the silylation solution comprises an aminosiloxane in an organic solvent.

4. The method according to claim 2 wherein the carboxylic acid anhydride groups of the polymer are maleic acid anhydride groups.

5. The method according to claim 2 wherein the carboxylic acid tert. butyl ester groups of the polymer are acrylic acid tert. butyl ester groups, methacrylic acid tert. butyl ester groups or vinyl benzoic acid tert. butyl ester groups.

6. The method according to claim 1 wherein the silylation solution comprises an aminosiloxane in an organic solvent.

7. The method according to claim 6 wherein the organic solvent is selected from the group consisting of anisole, dibutyl ether and diethylene glycol dimethyl ether.

8. The method according to claim 1 wherein the carboxylic acid anhydride groups of the polymer are maleic acid anhydride groups.

9. The method according to claim 8 wherein the polymer is a copolymer of maleic acid anhydride and a compound selected from the group consisting of acrylic acid tert. butyl ester, methacrylic acid tert. butyl ester and vinyl benzoic acid tert. butyl ester.

10. The method according to claim 1 wherein the carboxylic acid tert. butyl ester groups of the polymer are acrylic acid tert. butyl ester groups, methacrylic acid tert. butyl ester groups or vinyl benzoic acid tert. butyl ester groups.

11. The method according to claim 10 wherein the polymer is a copolymer of maleic acid anhydride and a compound selected from the group consisting of acrylic acid tert. butyl ester, methacrylic acid tert. butyl ester and vinyl benzoic acid tert. butyl ester.

12. The method according to claim 1 wherein the photoinitiator is an onium compound.

* * * * *